(12) United States Patent
Subramanian et al.

(10) Patent No.: US 6,836,398 B1
(45) Date of Patent: Dec. 28, 2004

(54) SYSTEM AND METHOD OF FORMING A PASSIVE LAYER BY A CMP PROCESS

(75) Inventors: Ramkumar Subramanian, Sunnyvale, CA (US); Jane V. Oglesby, Mountain View, CA (US); Minh Van Ngo, Fremont, CA (US); Mark S. Chang, Los Altos, CA (US); Sergey D. Lopatin, Santa Clara, CA (US); Angela T. Hui, Fremont, CA (US); Christopher F. Lyons, Fremont, CA (US); Patrick K. Cheung, Sunnyvale, CA (US); Ashok M. Khathuria, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/284,769

(22) Filed: Oct. 31, 2002

(51) Int. Cl.[7] ................................................ H01G 4/35
(52) U.S. Cl. ........................ 361/302; 361/303; 361/305; 361/321.1; 361/321.5; 361/311; 361/313; 257/529; 257/532
(58) Field of Search ................................ 361/302, 303, 361/305, 311, 313, 321.1, 321.4, 321.5, 306.1, 306.3, 328; 257/296, 529, 532; 438/692, 693, 397, 398, 396, 253, 254

(56) References Cited

U.S. PATENT DOCUMENTS

| | | | | | |
|---|---|---|---|---|---|
| 4,250,384 | A | * | 2/1981 | Pulvari | 250/330 |
| 5,920,792 | A | * | 7/1999 | Lin | 438/633 |
| 6,448,146 | B1 | * | 9/2002 | Lee et al. | 438/398 |
| 2002/0158262 | A1 | * | 10/2002 | Tsuchida | 257/91 |
| 2003/0053350 | A1 | * | 3/2003 | Krieger et al. | 365/200 |

* cited by examiner

*Primary Examiner*—Dean A. Reichard
*Assistant Examiner*—Nguyen T. Ha
(74) *Attorney, Agent, or Firm*—Amin & Turocy, LLP

(57) ABSTRACT

The present invention provides systems and methods that facilitate formation of semiconductor devices via planarization processes. The present invention utilizes dishing effects that typically occur during a chemical mechanical planarization (CMP) process. A reducing CMP process is performed on a semiconductor device in order to form a passive layer instead of performing a first CMP, followed by a deposition and a second CMP to form a passive layer. The reducing CMP process utilizes a slurry that includes a reducing chemistry that forms the passive layer in a dish region of an electrode. Thus, the passive layer is formed in conjunction with the reducing CMP process utilized for forming the electrode.

19 Claims, 8 Drawing Sheets

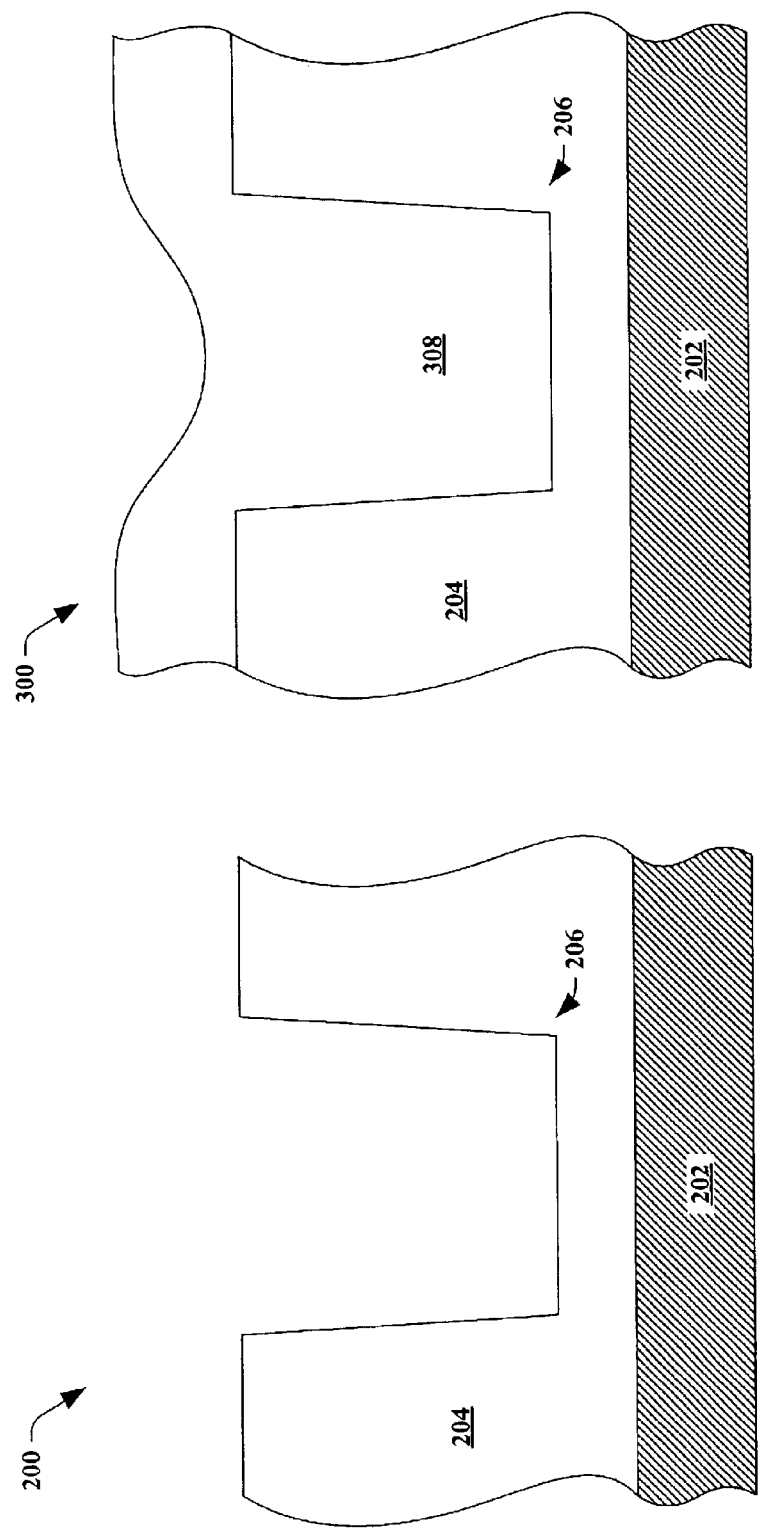

SYSTEM AND METHOD OF FORMING A PASSIVE LAYER BY A CMP PROCESS

FIELD OF INVENTION

The present invention relates generally semiconductor fabrication and, in particular, to systems and methods of forming a passive layer of an organic memory device via a planarization processes.

BACKGROUND OF THE INVENTION

The volume, use and complexity of computers and electronic devices are continually increasing. Computers consistently become more powerful, new and improved electronic devices are continually developed (e.g., digital audio players, video players). Additionally, the growth and use of digital media (e.g., digital audio, video, images, and the like) have further pushed development of these devices. Such growth and development has vastly increased the amount of information desired/required to be stored and maintained for computer and electronic devices.

Generally, memory devices are employed in computer and electronic devices to store and maintain this information. Memory devices are typically formed on a semiconductor material such as silicon via a plurality of semiconductor fabrication processes such as layering, doping, heat treatments and patterning. Layering is an operation that adds thin layers to the wafer surface. Layers can be, for example, insulators, semiconductors and/or conductors and are grown or deposited via a variety of processes. Some common deposition techniques are chemical vapor deposition (CVD), evaporation and sputtering. Doping is the process that adds specific amounts of dopants to the wafer surface. The dopants can cause the properties of layers to be modified (e.g., change a semiconductor to a conductor). A number of techniques, such as thermal diffusion and ion implantation can be employed for doping. Heat treatments are another basic operation in which a wafer is heated and cooled to achieve specific results. Typically, in heat treatment operations, no additional material is added or removed from the wafer, although contaminates and vapors may evaporate from the wafer. One common heat treatment is annealing, which repairs damage to crystal structure of a wafer/device generally caused by doping operations. Other heat treatments, such as alloying and driving of solvents, are also employed in semiconductor fabrication.

Generally, a memory device includes arrays of memory cells, wherein each memory cell can be accessed or "read", "written", and "erased" with information. The memory cells maintain information in an "off" or an "on" state (e.g., are limited to 2 states), also referred to as "0" and "1". To store this information, a memory cell includes a capacitor structure having a top electrode, also referred to as a cell plate, a bottom electrode, also referred to as a storage node, and a charge holding material (e.g., oxide, oxide/nitride/oxide (ONO), . . . ) formed in between the top electrode and the bottom electrode. The top electrode and the bottom electrode are formed of a conductive material. This capacitor permits storage of a charge that allows the memory cell to store a single bit of information. Such memory cells typically employ a refresh signal to maintain the charge on the capacitor and thus, their information. Some examples of memory devices that employ such a capacitor are dynamic random access memory (DRAM), double data rate memory (DDR), flash memory, metal oxide semiconductor field effect transistor (MOSFET), and the like.

Electrodes for semiconductor devices can be fabricated via a number of techniques. One technique that can be used is electroplating. Electroplating is a process for depositing metal by utilizing electrolysis with an aqueous metal salt solution. In a typical electroplating setup, two electrodes are immersed in a plating solution, such as a sample wafer and a counter electrode. Current is then supplied by an external power supply, and positively charged metal ions flow to the negatively charged cathode where they acquire electrons and deposit in the form of a metal film. Thus, when the wafer is charged negatively and the counter electrode positively, electroplating occurs. However, deposition occurs only on electrically contacted areas on a wafer. More importantly, the flow of electrons and ions can easily damage the already formed portions of the memory device.

Another technique that can be used is a basic damascene process, which does not require electrical current like the electroplating process described supra. The basic damascene process begins with forming a trench in a surface dielectric layer and depositing a barrier layer and/or a seed layer into the trench. Then, a metal material is deposited into the trench so as to substantially overfill the trench. Next, a chemical mechanical planarization process (CMP) is performed to re-planarize the surface of the wafer. A CMP process involves mounting the wafer on a rotating platen. The, a rotating polishing pad is pressured against the wafer surface. Next, a slurry carrying small abrasive particles is flowed onto the platen. These particles mechanically remove small pieces of the wafer surface (e.g., deposited metal material) which are carried away by movement of the slurry across the surface of the wafer. Additionally, the slurry also has a chemical component that dissolves or etches away surface materials (e.g., deposited metal). Typically, this chemical affect is some type of oxidation mechanism.

However, this basic damascene process utilizing CMP has a significant side effect. Deposition of metal materials during the damascene process generally results in a lower density of the metal material at the center of the trench. During the subsequent CMP process, the center (due to its lower density) polishes faster leaving a "dish" shape. This "dish" shape effect is generally referred to as "dishing" because of its shape.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The present invention relates generally to semiconductor fabrication and, in particular, to systems and methods of forming a passive layer via a planarization process.

The present invention forms a passive layer by taking advantage of dishing effects that typically occur during a chemical mechanical planarization (CMP) process. A reducing CMP process is performed on a semiconductor device in order to form a passive layer instead of performing a first CMP, followed by a deposition and a second CMP to form a passive layer. The reducing CMP process utilizes a slurry that includes a reducing layer is formed in conjunction with the reducing CMP process utilized for forming the electrode.

According to one aspect of the invention, a process control system comprises a semiconductor device, a process tool and a controller. The semiconductor device has a trench overfilled with a conductive material. The process tool is operable to perform a planarization process on the semiconductor device. The planarization process forms an electrode in the trench from the conductive material, forms a dish region in the electrode and forms a passive layer in the dish region. The controller controllably interfaces with the process tool, determines planarization process test parameters, controls the test parameters in situ, and dynamically modifies the test parameters based on feedback information.

According to another aspect of the invention, a method of fabricating a semiconductor device begins with depositing a conductive material so as to substantially overfill a trench on the semiconductor device. A planarization process is performed to substantially remove conductive material from regions outside of the trench. A dish region is formed in the trench in conjunction with the planarization process. A conductivity facilitating compound is formed from conductive material within the trench at the dish region in conjunction with performing the planarization process.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 2 is a cross sectional view of an organic memory device in accordance with an aspect of the present invention.

FIG. 3 is a cross sectional view of an organic memory device in accordance with an aspect of the present invention.

DETAILED DESCRIPTION OF THE INVENTION

Figure 1:
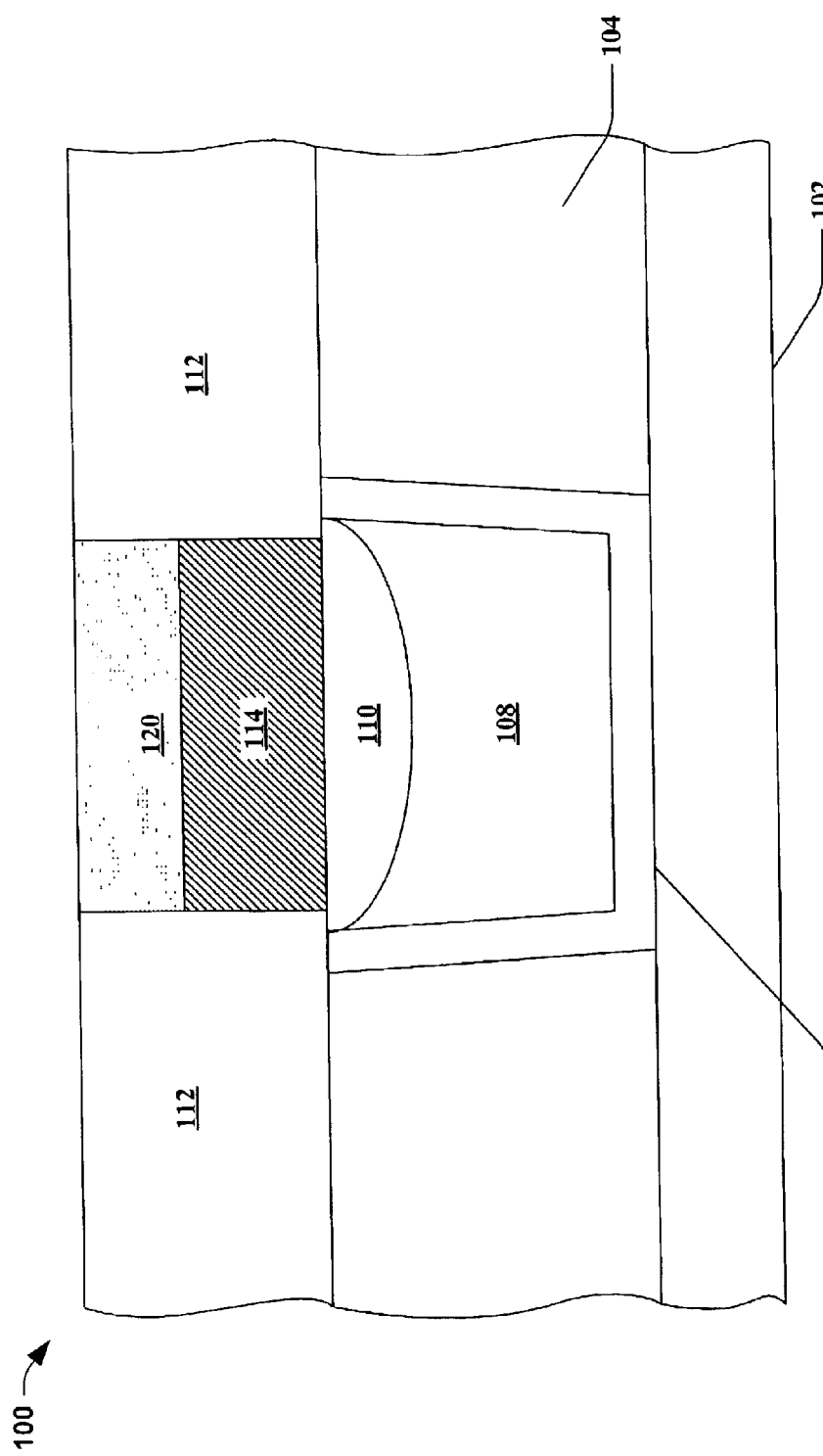
FIG. 1 is a cross sectional view of an organic memory device in accordance with an aspect of the present invention.

The following is a detailed description of the present invention made in conjunction with the attached figures, wherein like reference numerals will refer to like elements throughout.

Organic memory devices are memory devices that are at least partly based on organic materials and, are thus able to overcome some of the limitations of inorganic based memory devices. Organic memory devices facilitate increases in device density while also increasing device performance relative to conventional inorganic memory device. Additionally, organic memory devices are nonvolatile and, as such; do not require frequent refresh cycles or constant power. The cells of the organic memory device can have two or more states corresponding to various levels of impedance. These states are set by applying a bias voltage and then the cells remain in their respective states until another voltage, in reverse bias, is applied. The cells maintain their states with or without power (e.g., non-volatile) and can be read either electrically or optically by measuring injection current or light emission.

The present invention forms a passive layer for an organic memory device by taking advantage of dishing effects that typically occur during a chemical mechanical planarization (CMP) process of a basic damascene process. A reducing CMP process is performed on a semiconductor device in order to form a passive layer instead of performing a first CMP, followed by a deposition and a second CMP to form a passive layer. The reducing CMP process utilizes a slurry that includes a reducing chemistry that forms the passive layer on an electrode. Thus, a single CMP process is performed to form the electrode and the passive layer instead of performing two CMP processes and a separate deposition process. Reducing process steps, particularly CMP process steps, can result in significant cost savings and can improve device yields.

Beginning now with FIG. 1, a cross sectional view of an organic memory device 100 in accordance with an aspect of the present invention is depicted. The organic memory device 100 includes a first dielectric layer 104, a barrier layer 106, a bottom electrode 108, a passive layer 110, a second dielectric layer 112, an organic layer 114 and a top electrode 120. The passive layer 110 of the organic memory device 100 is formed in conjunction with a chemical mechanical planarization process (CMP) employed for forming a bottom electrode 108.

The dielectric layer 104 is formed on a semiconductor substrate 102 and can be comprised of a semiconductor material such as, for example, substantially any type of material having dielectric properties. The substrate 102 includes one or more semiconductor layers. A trench is formed in the dielectric layer 104 to permit formation of the bottom electrode. Typically, some type of patterning/etching process is employed to form the trench. The barrier layer 106 is formed within the trench, including the bottom and sidewalls to mitigate diffusion of the bottom electrode 108 into the dielectric layer 104 and/or the substrate 102.

The bottom electrode 108 is formed in the trench over the barrier layer 106. The bottom electrode 108 is comprised of a conductive material such as, aluminum, chromium, copper, germanium, gold, magnesium, manganese, indium, iron, nickel, palladium, platinum, silver, titanium, zinc, alloys thereof, indium-tin oxide, polysilicon, doped amorphous silicon, metal suicides, and the like. Exemplary alloys that can be utilized for the conductive material include Hastelloy®, Kovarl®, Invar, Monel®, Inconel®, brass, stainless steel, magnesium-silver alloy, and various other alloys. The bottom electrode is formed by a damascene process that includes depositing the conductive material (e.g., by sputtering) and performing a reducing CMP to remove the conductive material from areas outside of the trench. The reducing CMP process employed results in "dishing" of the bottom electrode 108 therein forming a dish region.

The passive layer 110 is formed on the bottom electrode in conjunction with the reducing CMP process employed for forming the bottom electrode. Thus, the passive layer 110 is "grown" from the bottom electrode (e.g., copper sulfide grown from copper) and forms in the dish region. The reducing CMP process includes a slurry with particles and a reducing chemistry. The reducing chemistry causes the passive layer 110 to be formed. As an example, a reducing chemistry including sulfur can be employed for a bottom electrode comprised of copper to form a passive layer of copper sulfide. It is appreciated that other suitable reducing chemistries can be employed in the present invention.

The passive layer 110 contains at least one conductivity facilitating compound that has the ability to donate and accept charges (holes and/or electrons). Examples of conductivity facilitating compounds that can be employed for the passive layer 106 include one or more of the following: copper sulfide ($Cu_2S$, CuS), copper oxide (CuO, $Cu_2O$), manganese oxide ($MnO_2$), titanium dioxide ($TiO_2$), indium oxide ($I_3O_4$), silver sulfide ($Ag_2S$, AgS), , iron oxide ($Fe_3O_4$), and the like. Generally, the conductivity facilitating compound has at least two relatively stable oxidation-reduction states which permit the conductivity facilitating compound to donate and accept charges. The passive layer 110 can be grown using oxidation techniques, formed via gas phase reactions, deposited between the electrodes and/or using other suitable techniques.

The passive layer 110 is operative to facilitate transport of charge from the bottom electrode 108. Additionally, the passive layer 110 facilitates charge carrier (e.g., electrons or holes) injection into the organic layer 114 and increases the concentration of the charge carrier in the organic layer resulting in a modification of the conductivity of the organic layer 114. Furthermore, the passive layer 110 can also store opposite charges in the passive layer 110 in order to balance the total charge of the memory device 100.

The second dielectric layer 112 is selectively formed (e.g., deposited and patterned) over at least a portion of the dielectric layer 104 and at least a portion of the passive layer 110. The second dielectric layer 112 is patterned so as to allow proper formation of the electrode/capacitor stack. The second dielectric layer 112 can be comprised of dielectric materials similar to those employed for the first dielectric layer 104. It is appreciated that a combination of the second dielectric layer 112 and the dielectric layer 104 can also be referred to as an inner layer dielectric.

The organic layer 114 is formed on the passive layer 110. The formation of the organic layer 114 on the passive layer 110 defines an interface between the two layers. The organic layer 114 can be formed via a number of suitable techniques described infra. The organic layer 114 can be formed after formation of the top electrode 120 in order to grow the organic layer 114 from the passive layer 110. The organic layer 114 is comprised of a conjugated organic material, such as a small organic molecule and a conjugated polymer. The conjugated nature of the conjugated organic materials contributes to the controllably conductive properties of the selectively conductive media.

The conjugated organic material has the ability to donate and accept charges (holes and/or electrons). Generally, the conjugated organic molecule has at least two relatively stable oxidation-reduction states. The two relatively stable states permit the conjugated organic polymer to donate and accept charges and electrically interact with the conductivity facilitating compound of the passive layer 110. Examples of conjugated organic polymers that can be employed for the organic layer 114 include one or more of polyacetylene (cis or trans); polyphenylacetylene (cis or trans); polydiphenylacetylene; polyaniline; poly(p-phenylene vinylene); polythiophene; polyporphyrins; porphyrinic macrocycles, thiol derivatized polyporphyrins; polymetallocenes such as polyferrocenes, polyphthalocyanines; polyvinylenes; polystiroles; and the like. Additionally, the properties of the organic material can be modified by doping with a suitable dopant (e.g., salt).

The top electrode 120 is formed on the organic layer 114 and/or over the passive layer 110. The top electrode 120 is comprised of a conductive material such as, aluminum, chromium, copper, germanium, gold, magnesium, manganese, indium, iron, nickel, palladium, platinum, silver, titanium, zinc, alloys thereof, indium-tin oxide, polysilicon, doped amorphous silicon, metal silicides, and the like. Exemplary alloys that can be utilized for the conductive material include Hastelloy®, Kovar®, Invar, Monel®, Inconel®, brass, stainless steel, magnesium-silver alloy, and various other alloys. The top electrode 120 can be comprised of nickel, cobalt, chromium, silver, copper, other suitable materials, and/or alloys thereof. Additionally, alloys with copper and alloys with phosphor and boron can also be employed. It is appreciated that the conductive material employed for the top electrode can, but not necessarily, be different than the conductive material employed for the bottom electrode.

FIGS. 2–5 illustrate various stages of an organic semiconductor device fabrication process in accordance with an aspect of the present invention. It is appreciated that these stages are not necessarily comprehensive and complete in order to form a device. Additionally, it is appreciated that other stages and/or variations thereof can be contemplated and still be in accordance with the present invention.

Beginning with FIG. 2, a cross sectional view 200 of an organic memory device in accordance with an aspect of the present invention is illustrated. The device is shown at a first stage of fabrication. A first dielectric layer 204 has been deposited or formed on a substrate 202. The substrate 202 comprises one or more semiconductor layers. The first dielectric layer 204 is comprised of a suitable dielectric material. After the first dielectric layer 204 has been formed, a trench 206 is formed in the first dielectric layer. The trench 206 is formed to a desired width and height. The trench 206 will ultimately used to form some structures of the organic memory device. Additionally, although not so illustrated, a barrier layer and/or a seed layer can be formed in the trench. The barrier layer can prevent diffusion of device components and the seed layer can facilitate electrode formation.

Continuing with FIG. 3, another cross sectional view 300 of the organic memory device in accordance with an aspect of the present invention is illustrated. This view 300 illustrates a metal layer 308 being formed over a surface of the device in a next stage of fabrication.

A first conductive material is deposited over the surface of the organic memory device. The first conductive material is comprised of a conductive material such as, aluminum, chromium, copper, germanium, gold, magnesium, manganese, indium, iron, nickel, palladium, platinum, silver, titanium, zinc, alloys thereof, indium-tin oxide, polysilicon, doped amorphous silicon, metal silicides, and the like. Exemplary alloys that can be utilized for the conductive material include Hastelloy®, Kovar®, Invar, Monel®, Inconel®, brass, stainless steel, magnesium-silver alloy, and various other alloys. A suitable fabrication process such as sputtering can be used to deposit the first conductive material.

Figure 4:
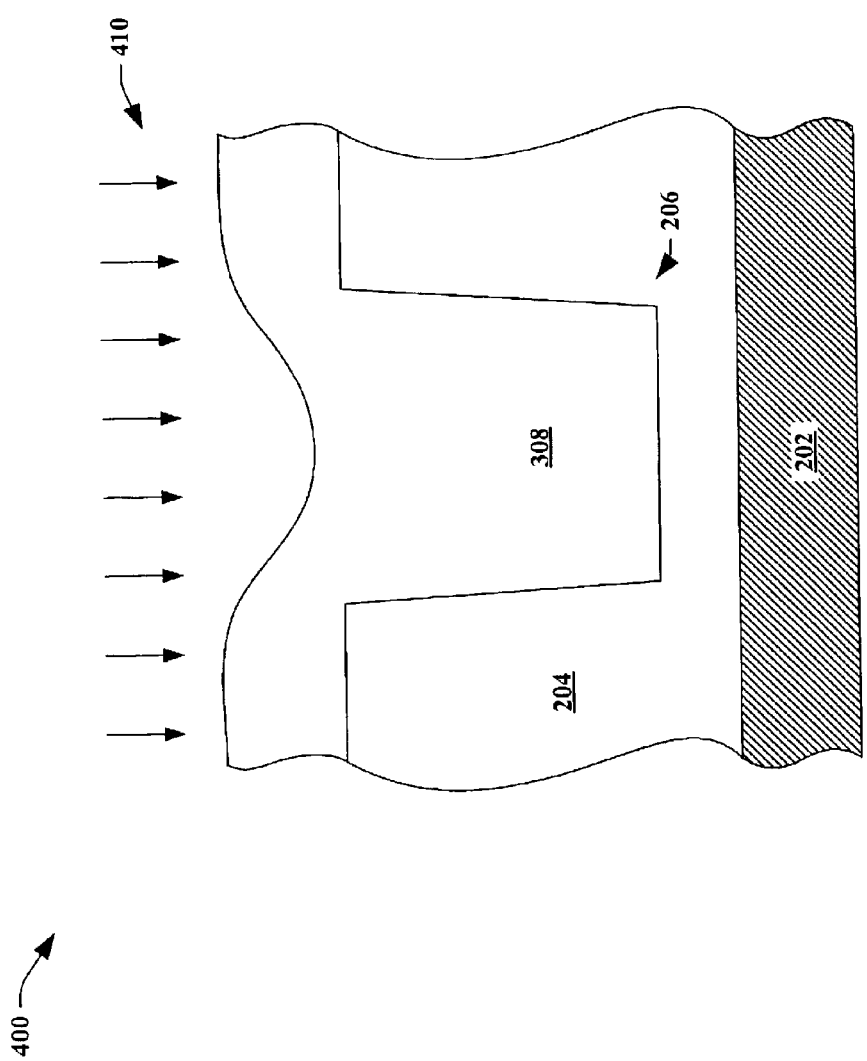
FIG. 4 is a cross sectional view of an organic memory device in accordance with an aspect of the present invention.

Continuing on with FIG. 4, yet another cross sectional view 400 of the organic memory device in accordance with an aspect of the present invention is depicted. A reducing CMP process 410 is performed at this stage of fabrication in order to form an electrode and passive layer.

The reducing CMP process 410 employs a slurry and a pad (not shown). The slurry comprises an abrasive compound and a reducing chemistry (e.g., sulfur). The abrasive compound includes small particles that mechanically remove conductive material from the metal layer 308. Additionally, the reducing chemistry also causes conductive material to be removed from the metal layer 308, but via chemical reactions. Removed conductive material is washed away from the device during the reducing CMP process.

In addition to removing the conductive material, the reducing chemistry also causes a conductivity facilitating compound to be formed (e.g., copper sulfide) from a reducing agent and the conductive material. However, because of the planarization resulting from the reducing CMP process, the conductivity facilitating compounds formed outside of the trench 206 are substantially removed. Some examples of other conductivity facilitating compounds that can be employed include one or more of the following: copper sulfide ($Cu_2S$, CuS), copper oxide (CuO, $Cu_2O$), manganese oxide ($MnO_2$), titanium dioxide ($TiO_2$), indium oxide ($I_3O_4$), silver sulfide ($Ag_2S$, AgS), iron oxide ($Fe_3O_4$), and the like. However, it is appreciated that the deposited conductive material and the reducing agent correspond to the desired conductivity facilitating compound.

Figure 5:
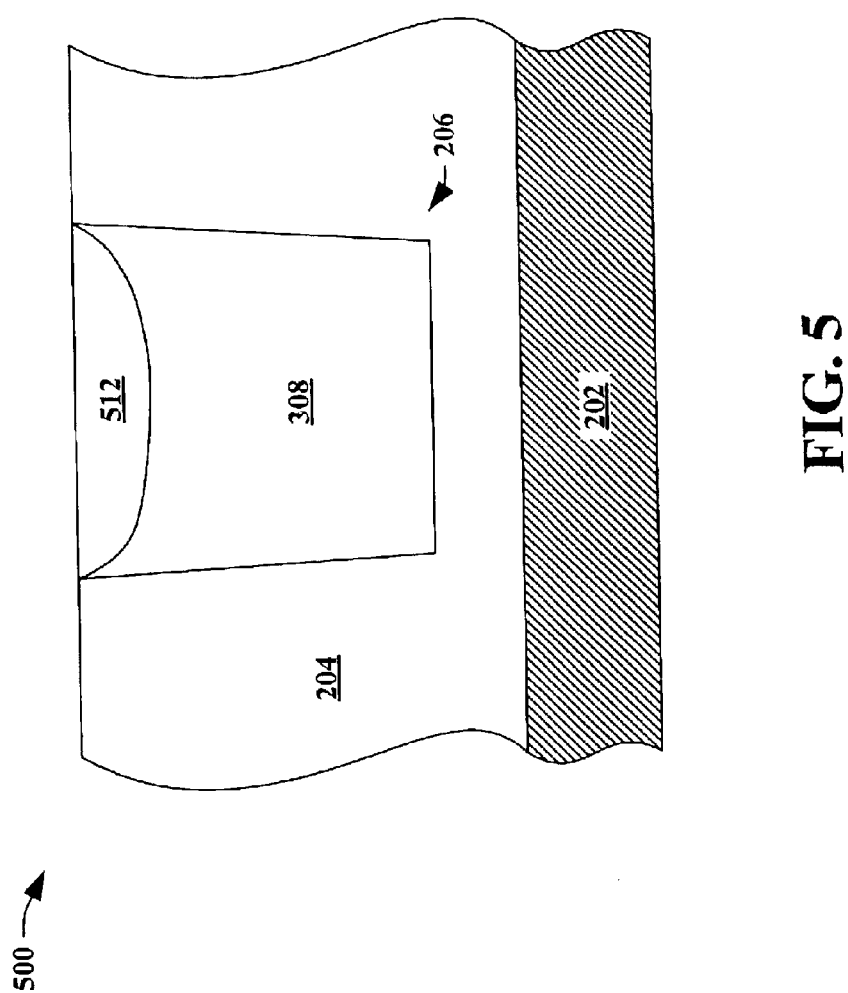
FIG. 5 is a cross sectional view of an organic memory device in accordance with an aspect of the present invention.

Referring now to FIG. 5, another cross sectional view 500 of the organic memory device in accordance with an aspect of the present invention is depicted. This view 500 illustrates the result of the reducing CMP process performed in FIG. 4.

The metal layer has been transformed into a bottom electrode 308 and a passive layer 512 is shown formed on the bottom electrode 308, but within the trench 206. As expected, the bottom electrode 308 is comprised of the conductive material and the passive layer 512 is comprised of the conductivity facilitating compound.

Although not shown, other layers/structures of the organic memory device can be formed including, but not limited to, an organic layer and a top electrode.

Figure 6:
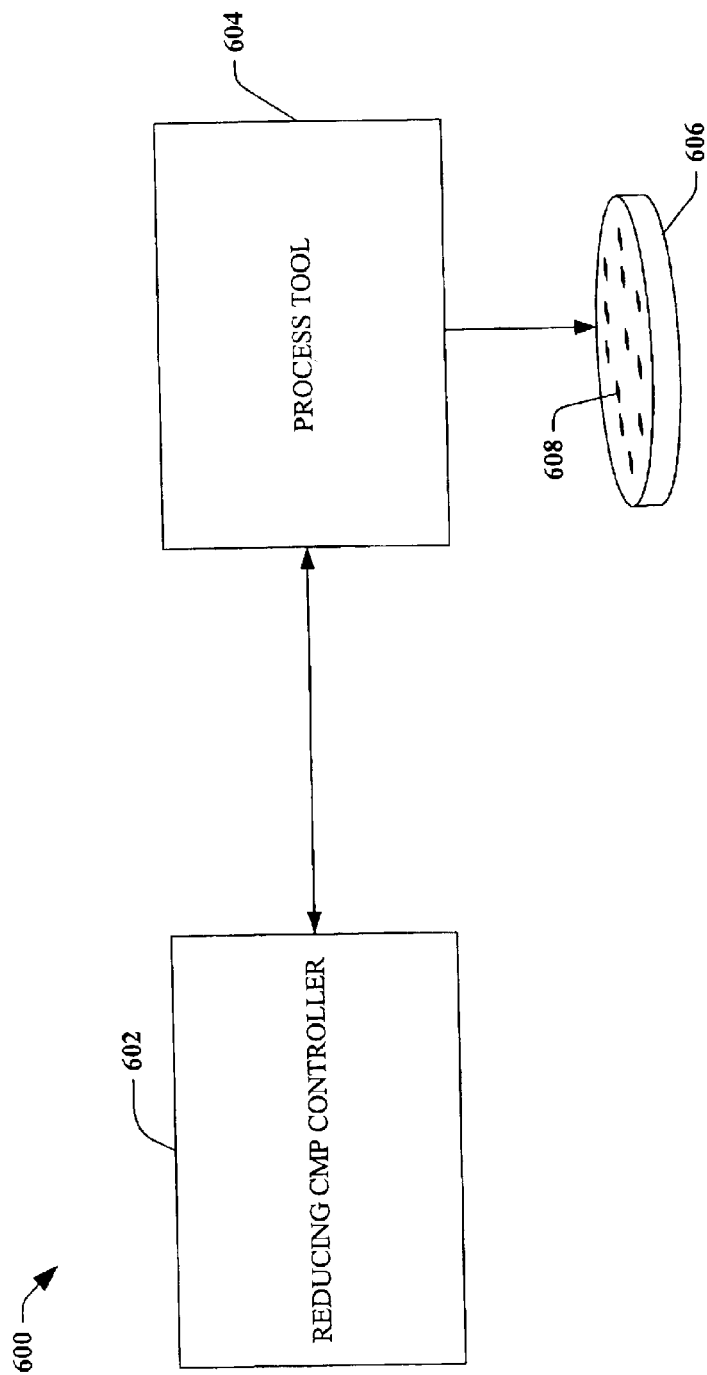
FIG. 6 is a block diagram illustrating a system for fabricating memory devices in accordance with an aspect of the present invention.

Turning now to FIG. 6, a block diagram of a system 600 for fabricating memory devices in accordance with an aspect of the present invention is depicted. The system includes a reducing CMP controller 602, a process tool 604 and a wafer 606. The wafer 606 has memory device(s) 608 being fabricated on/in it. Specifically, the system 600 is operative to at least partly form an electrode and passive as part the memory device 603 as a result of a reducing CMP process.

The reducing CMP controller 602 is operative to interface with the process tool 604 so as to controllably perform a reducing CMP process. The controller 602 determines and controls a number of test parameters for the fabrication process such as slurry, abrasive component, reducing chemistry, reducing agent, flow rate, duration, thickness of electrode, temperature and the like. These test parameters are selected and/or determined to meet design and/or process goals for the electrode fabrication process for this memory device. Simulations, modeling, neural networks, Bayesian networks, Bayesian belief networks and other mechanisms can be employed to determine the test parameters. It is appreciated that the CMP process is typically one of many fabrication processes required for the memory device 608. The reducing CMP controller 602 can be implemented on a computer and/or as a computer component.

Although not so illustrated, the reducing CMP controller 602 is able to receive and process feedback and feed forward information during the electrode fabrication process. While the test parameter determination techniques discussed supra are generally sufficient, real world results can vary. Thus, based on the feedback information, the reducing CMP controller 602 is able to dynamically modify the test parameters to more closely obtain desired dimensions (e.g., CMP endpoint detection).

As stated supra, the process tool 604 is controlled by the reducing CMP controller 602 and performed the desired process on the memory device 608. The process tool 604 is the system component that physically and controllably performs fabrication process (e.g., by dispensing resist, dispensing slurry, rotating a pad, patterning, rotating a wafer, etching and the like) according to test parameters. The process tool 604 controllably and performs the reducing CMP process. Additionally, the process tool 604 initiates and controls flow of the slurry and the composition of the slurry. In addition to controlling the fabrication process, the process tool 604 also includes components and/or devices that gather fabrication information during fabrication (e.g., in situ) and/or after fabrication (e.g., inspection). This fabrication information can include, for example, critical dimensions (e.g., in x and y directions, width and pitch (2D and 3D), temperature, pressure, overlay, defect and the like). Pitch measurements are measurements between substantially equivalent features. Width measurements are measurements of a single feature. Typically, devices such as scanning electron microscopes (SEM) and optical microscopy are utilized to obtain the measurements.

Referring once again to the reducing CMP controller 604, the reducing CMP process operates on a metal layer that overfills a trench. The reducing CMP process causes dishing to occur and causes conductivity facilitating compounds to form in the trench on the metal layer thereby forming a passive layer on an electrode.

The system 600, in addition to forming electrodes, bottom electrodes, passive layers and the like, can be employed for other suitable fabrication process such as, but not limited to, metallization, patterning, etching, doping, deposition, sputtering, polishing, and the like. Additionally, the system 600 and other aspects of the invention can be utilized to fabricate semiconductor devices that can be employed in a wide variety of computer and electronic devices such as computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to weight reductions and/or increased computing capacity (e.g., increased processing power and memory storage). Examples of hand-held devices include cell phones and other two way communication devices, personal data assistants, palm pilots, pagers, notebook computers, remote controls, recorders (video and audio), radios, small televisions and web viewers, cameras, and the like.

Figure 7:
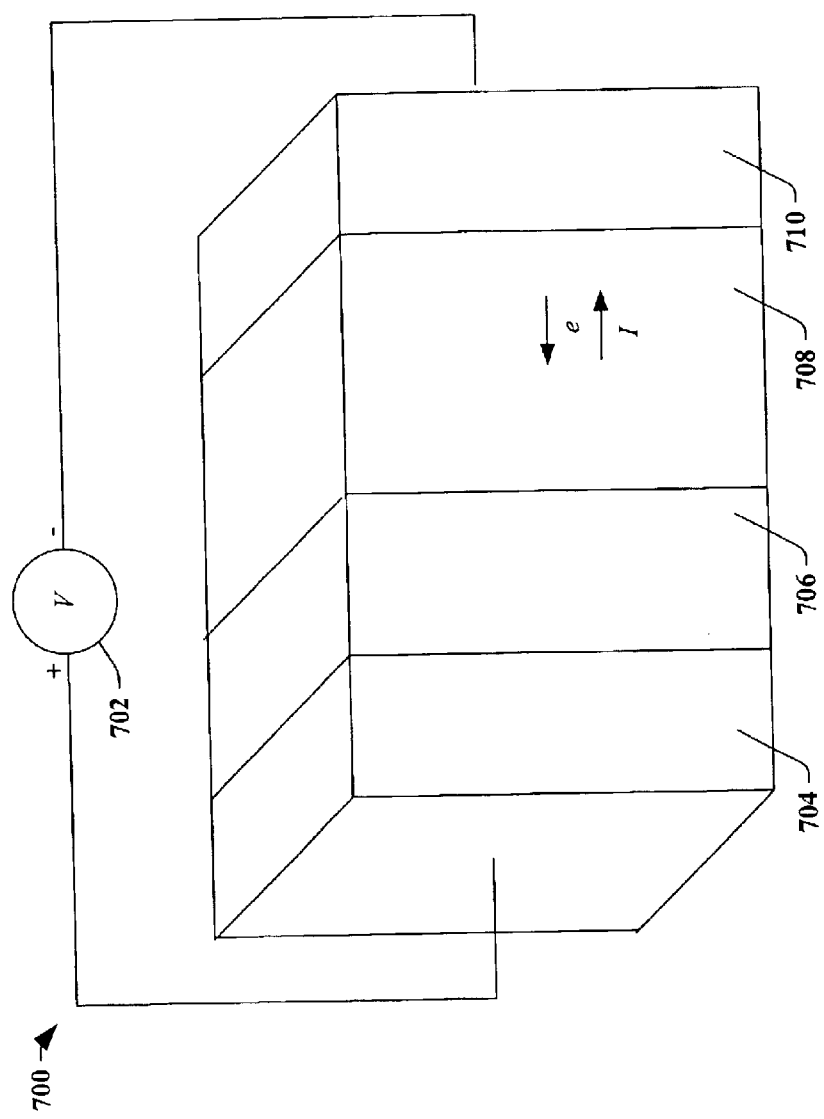
FIG. 7 is a three dimensional diagram illustrating an organic memory device in accordance with an aspect of the present invention.

Referring to FIG. 7, a three dimensional diagram of an organic memory device 700 in accordance with an aspect of the present invention is depicted. The memory device includes a first electrode 704, a passive layer 706, an organic polymer layer 708, and a second electrode 710. The diagram also illustrates a voltage source 702 connected to the first electrode 704 and the second electrode 710 that applies a voltage on the first electrode 704 and the second electrode 710. The voltage source 702 is depicted as connected for illustrative purposes, but can also be disconnected from the organic memory device.

The first electrode 704 and the second electrode 710 are comprised of a conductive material such as, aluminum, chromium, copper, germanium, gold, magnesium, manganese, indium, iron, nickel, palladium, platinum, silver, titanium, zinc, alloys thereof, indium-tin oxide, polysilicon, doped amorphous silicon, metal silicides, and the like. Exemplary alloys that can be utilized for the conductive material include Hastelloy®, Kovar®, Invar, Monel®, Inconel®, brass, stainless steel, magnesium-silver alloy, and various other alloys.

The thickness of the first electrode 704 and the second electrode 710 can vary depending on the implementation and the memory device being constructed. However, some exemplary thickness ranges include about 0.01 $\mu$m or more and about 10 $\mu$m or less, about 0.05 $\mu$m or more and about 5 $\mu$m or less, and/or about 0.1 $\mu$m or more and about 1 $\mu$m or less.

The organic layer 708 and the passive layer 706 are collectively referred to as a selectively conductive media or selectively conductive layer. The conductive properties of this media (e.g., conductive, non-conductive, semi-conductive) can be modified in a controlled manner by applying various voltages across the media via the electrodes 704 and 710.

The organic layer 708 is comprised of a conjugated organic material, such as a small organic molecule and a conjugated polymer. If the organic layer is polymer, a polymer backbone of the conjugated organic polymer may extend lengthwise between the electrodes 704 and 710 (e.g., generally substantially perpendicular to the inner, facing surfaces of the electrodes 704 and 710). The conjugated organic molecule can be linear or branched such that the backbone retains its conjugated nature. Such conjugated molecules are characterized in that they have overlapping $\pi$ orbitals and that they can assume two or more resonant structures. The conjugated nature of the conjugated organic materials contributes to the controllably conductive properties of the selectively conductive media.

In this connection, the conjugated organic material has the ability to donate and accept charges (holes and/or electrons). Generally, the conjugated organic molecule has at least two relatively stable oxidation-reduction states. The two relatively stable states permit the conjugated organic polymer to donate and accept charges and electrically interact with the conductivity facilitating compound.

The organic material can be cyclic or acyclic. For some cases, such as organic polymers, the organic material self assembles between the electrodes during formation or deposition. Examples of conjugated organic polymers include one or more of polyacetylene (cis or trans); polyphenylacetylene (cis or trans); polydiphenylacetylene; polyaniline; poly(p-phenylene vinylene); polythiophene; polyporphyrins; porphyrinic macrocycles, thiol derivatized polyporphyrins; polymetallocenes such as polyferrocenes, polyphthalocyanines; polyvinylenes; polystiroles; and the like. Additionally, the properties of the organic material can be modified by doping with a suitable dopant (e.g., salt).

The organic layer 708 has a suitable thickness that depends upon chosen implementations and/or the memory device being fabricated. Some suitable exemplary ranges of thickness for the organic polymer layer 708 are about 0.001 $\mu$m or more and about 5 $\mu$m or less, about 0.01 $\mu$m or more and about 2.5 $\mu$m or less, and about a thickness of about 0.05 Mm or more and about 1 $\mu$m or less.

The organic layer 708 can be formed via a number of suitable techniques. One suitable technique that can be utilized is a spin-on technique which involves depositing a mixture of the material and a solvent, and then removing the solvent from the substrate/electrode. Another suitable technique is chemical vapor deposition (CVD). CVD includes low pressure chemical vapor deposition (LPCVD), plasma enhanced chemical vapor deposition (PECVD), and high density chemical vapor deposition (HDCVD). It is not typically necessary to functionalize one or more ends of the organic molecule in order to attach it to an electrode/passive layer. Sometimes, it may have a chemical bond formed between the conjugated organic polymer and the passive layer 706.

The passive layer 706 contains at least one conductivity facilitating compound that contributes to the controllably conductive properties of the selectively conductive media. The conductivity facilitating compound has the ability to donate and accept charges (holes and/or electrons). Generally, the conductivity facilitating compound has at least two relatively stable oxidation-reduction states. The two relatively stable states permit the conductivity facilitating compound to donate and accept charges and electrically interact with the organic layer 708. The particular conductivity facilitating compound employed is selected so that the two relatively stable states match with the two relatively stable states of the conjugated organic molecule of the layer 708.

The passive layer 706 is operative to transport charge from the first electrode 704 to the interface between the organic layer 708 and the passive layer 706. Additionally, the passive layer 706 facilitates charge carrier (e.g., electrons or holes) injection into the organic layer 708 and increases the concentration of the charge carrier in the organic layer resulting in a modification of the conductivity of the organic layer 708. Furthermore, the passive layer 706 can also store opposite charges in the passive layer 706 in order to balance the total charge of the device 700.

The passive layer 706 can in some instances act as a catalyst when forming the organic layer 708. In this connection, the backbone of the conjugated organic molecule may initially form adjacent the passive layer 706, and grow or assemble away and substantially perpendicular to the passive layer surface. As a result, the backbones of the conjugated organic molecule maybe self aligned in a direction that traverses the two electrodes.

Examples of conductivity facilitating compounds that may make up the passive layer 706 include one or more of copper sulfide ($Cu_2S$, $CuS$), copper oxide ($CuO$, $Cu_2O$), manganese oxide ($MnO_2$), titanium dioxide ($TiO_2$), indium oxide ($I_3O_4$), silver sulfide ($Ag_2S$, $AgS$),, iron oxide ($Fe_3O_4$), and the like. The passive layer 706 may be grown using oxidation techniques, formed via gas phase reactions, or deposited between the electrodes.

The passive layer 706 has a suitable thickness that can vary based on the implementation and/or memory device being fabricated. Some examples of suitable thicknesses for the passive layer 706 are as follows: a thickness of about 2 Å or more and about 0.1 $\mu$m or less, a thickness of about 10 Å or more and about 0.01 $\mu$m or less, and a thickness of about 50 Å or more and about 0.005 $\mu$m or less.

One suitable technique to form the passive layer 706 is to employ a reducing CMP process. This process creates a dishing effect on the first electrode 704 and forms or grows the passive layer 706 in the "dish" portion. This technique can eliminate one or more additional fabrication processing steps.

In order to facilitate operation of the organic memory device, the organic layer 708 is generally thicker than the passive layer 706. In one aspect, the thickness of the organic layer is from about 0.1 to about 500 times greater than the thickness of the passive layer. It is appreciated that other suitable ratios can be employed in accordance with the present invention.

The organic memory device, like conventional memory devices, can have two states, a conductive (low impedance or "on") state or non-conductive (high impedance or "off") state. However, unlike conventional memory devices, the organic memory device is able to have/maintain a plurality of states, in contrast to a conventional memory device that is limited to two states (e.g., off or on). The organic memory device can employ varying degrees of conductivity to identify additional states. For example, the organic memory device can have a low impedance state, such as a very highly conductive state (very low impedance state), a highly conductive state (low impedance state), a conductive state (medium level impedance state), and a non-conductive state (high impedance state) thereby enabling the storage of multiple bits of information in a single organic memory cell, such as 2 or more bits of information or 4 or more bits of information (e.g., 4 states providing 2 bits of information, 8 states providing 3 bits of information . . . ).

During typical device operation, electrons flow from the second electrode 710 through the selectively conductive media to the first electrode 704 based on a voltage applied to the electrodes by the voltage source 702 if the organic layer is n-type conductor. Alternately, holes flow from the first electrode 704 to second electrode 710 if the organic layer 708 is p-type conductor, or both electrons and holes flow in the organic layer if it can be both n and p type with proper energy band match with 706 and 710. As such, current flows from the first electrode 704 to the second electrode 710 via the selectively conductive media.

Switching the organic memory device to a particular state is referred to as programming or writing. Programming is accomplished by applying a particular voltage (e.g., 9 volts, 2 volts, 1 volts,. . . ) across the selectively conductive media via the electrodes 704 and 710. The particular voltage, also referred to as a threshold voltage, varies according to a respective desired state and is generally substantially greater than voltages employed during normal operation. Thus, there is typically a separate threshold voltage that corresponds to respective desired states (e.g., "off", "on" . . . ). The threshold value varies depending upon a number of factors including the identity of the materials that constitute the organic memory device, the thickness of the various layers, and the like. The voltage supply 702 is controllably employed to apply the threshold voltage in this aspect of the invention. However, other aspects of the invention can utilize other means to apply threshold voltages.

Generally speaking, the presence of an external stimuli such as an applied electric field that exceeds a threshold value ("on" state) permits an applied voltage to write, read, or erase information into/from the organic memory cell; whereas the absence of the external stimuli that exceeds a threshold value ("off" state) prevents an applied voltage to write or erase information into/from the organic memory cell.

To read information from the organic memory device, a voltage or electric field (e.g., 2 volts, 1 volts, 0.5 volts) is applied via the voltage source 702. Then, an impedance measurement is performed which, therein determines which operating state the memory device is in (e.g., high impedance, very low impedance, low impedance, medium impedance, and the like). As stated supra, the impedance relates to, for example, "on" (e.g., 1) or "off" (e.g., 0) for a dual state device or to "00", "01", "10", or "11" for a quad state device. It is appreciated that other numbers of states can provide other binary interpretations. To erase information written into the organic memory device, a negative voltage or a polarity opposite the polarity of the writing signal that exceeds a threshold value is applied.

Figure 8:
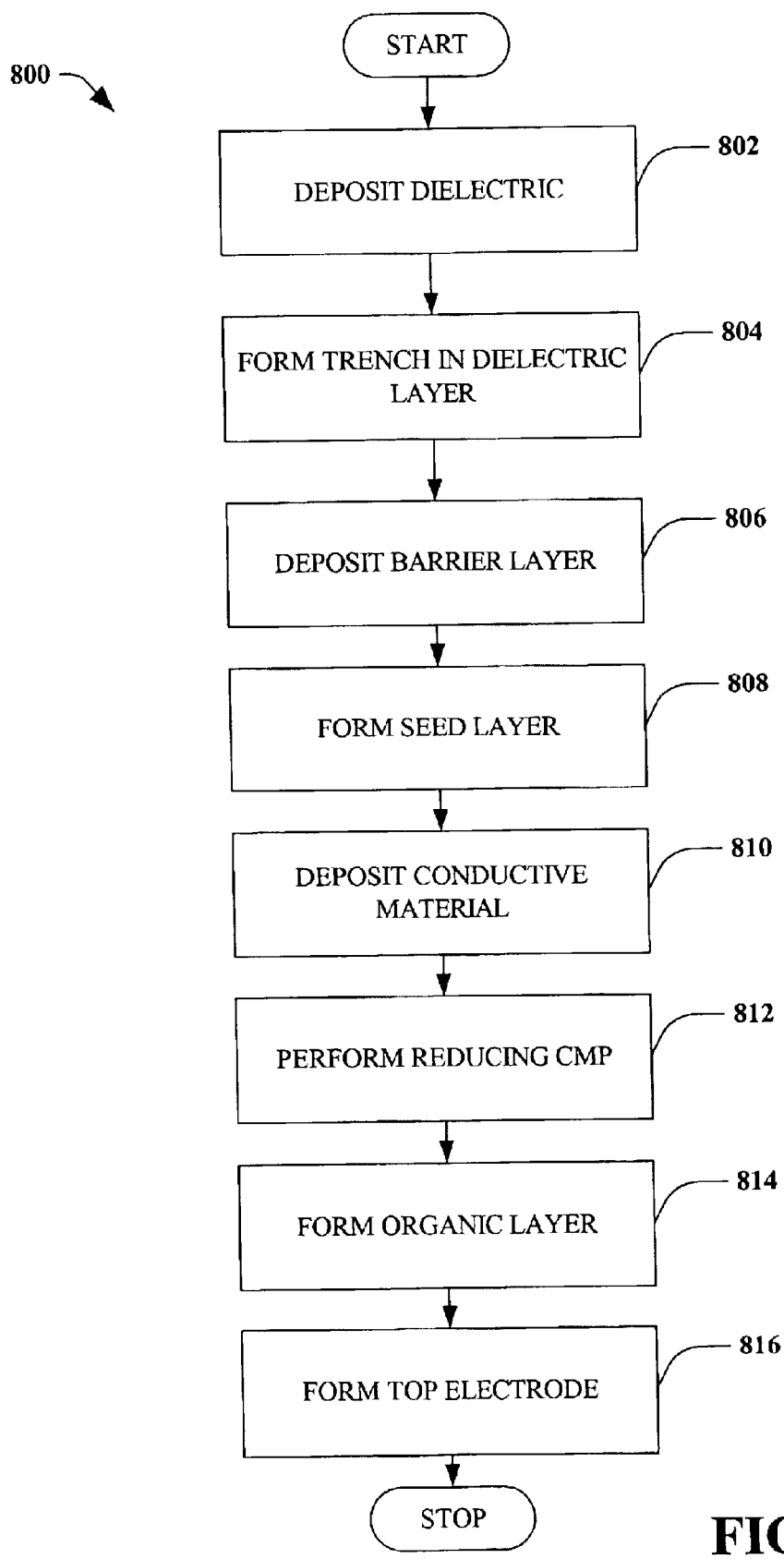
FIG. 8 is a flow diagram illustrating a method of fabricating an organic memory device in accordance with an aspect of the present invention.
Figure 9:
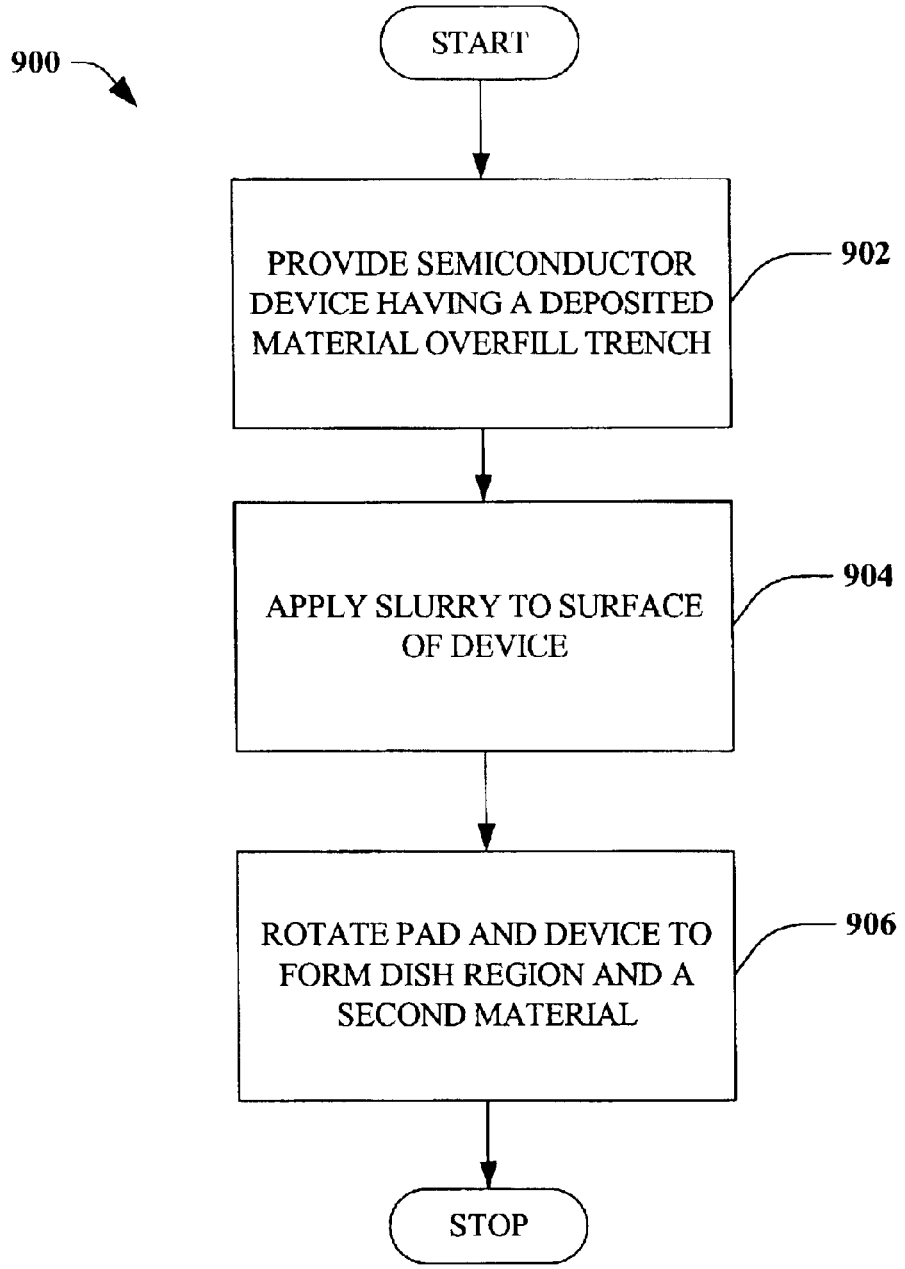
FIG. 9 is a flow diagram illustrating a method of forming a layer in conjunction with a planarization process.

In view of the foregoing structural and functional features described above, methodologies in accordance with various aspects of the present invention will be better appreciated with reference to FIGS. 8–9. While, for purposes of simplicity of explanation, the methodologies of FIGS. 8–9 is depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

Turning now to FIG. 8, a method 800 of fabricating an organic memory device in accordance with an aspect of the present invention is disclosed. The method 800 includes forming a passive layer in conjunction with a planarization process. It is appreciated that the method 800 can be performed by the system described in FIG. 6.

The method 800 begins at 802 wherein a first dielectric material is deposited on a semiconductor substrate having at least one semiconductor layer. The deposited dielectric material comprises a first dielectric layer. Then, a trench is formed in the first dielectric layer at 804. The trench is formed to a desired depth and width and is to be employed to contain some structure(s) of the organic memory device. Continuing on, a barrier layer is deposited in the trench at 806. The barrier layer is formed by depositing a barrier layer material. The barrier layer mitigates diffusion for later formed components. Then, a seed layer is formed on the barrier layer at 808. The seed layer is typically a conductive material and is selected to facilitate electrode formation. Subsequently, a first conductive material is deposited over the device and overfilling the trench at 810. The first conductive material can be a suitable material such as copper as described supra.

After the first conductive material has been deposited, a reducing CMP process is performed at 812. The reducing CMP process removes excess conductive material from outside of the trench, causes a dish region to occur to the conductive material in the trench and forms a bottom electrode from the remaining conductive material in the trench. Furthermore, the reducing CMP process employs a reducing chemistry in a slurry that reacts with the deposited conductive material and thereby forms a passive layer in the dish region. The passive layer includes a conductivity facilitating compound such as copper sulfide and the like, which are also described supra.

The method 800 continues on at 814 wherein an organic layer is formed on the passive layer. Suitable materials for the organic layer are described supra, but omitted here for brevity. Then, a top electrode is formed on the organic layer at 816. The top electrode is formed by a suitable conductive material deposition process such as sputtering, electrolysis and electroless formation. It is also appreciated that a second dielectric layer can be formed on the device and etched prior to formation of the organic layer. The combination of the second dielectric layer and the first dielectric layer can be referred to as an inner dielectric layer (ILD).

FIG. 9 is a flow diagram of a method 900 of forming a layer via a planarization process in accordance with an aspect of the present invention. The method 900 employs a reducing CMP process that substantially simultaneously forms the passive layer while planarizing a previously deposited material. It is appreciated that the method 900 can be performed by the system described in FIG. 6.

The method 900 begins at 902 wherein a semiconductor device is provided that has a trench and deposited material that overfills the trench. The deposited material can be a conductive material such as a metal (e.g., copper). Alternate aspects of the invention can employ a semiconductor device with a via or plug instead of a trench and still be in accordance with the present invention. Then, at 904, a slurry is applied to a surface of the semiconductor device. The slurry includes an abrasive component and a chemical component. The abrasive component is a relatively small particle selected to mechanically polish/remove material from the memory device. The chemical component is also selected so as to remove/polish material from the memory device. Additionally, the chemical component also includes a reducing agent that can interact with the deposited material to form a second material (e.g., copper sulfide) or layer.

A polishing pad and/or the memory device are substantially in contact with each other and rotated in opposite directions at 906 therein facilitating removal of the deposited material. A dish region is formed in the trench and the second material grown from the deposited material to form a layer comprising the second material in the dish region.

The method 900 can be employed to form electrodes and passive layers for organic memory devices. However, it is appreciated that the method 900 can also be utilized to form other types of layers for other types of semiconductor devices in conjunction with a CMP process.

What has been described above are one or more aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in either the detailed description and the claims, such term is intended to be inclusive in a manner similar to the term "comprising."

What is claimed is:

1. An organic memory device comprising:
   a lower electrode comprising a dish region; and
   a passive layer grown from and formed within the dish region, and interposed between the lower electrode and an organic layer, the passive layer facilitates charge carrier injection into the organic layer.

2. The device of claim 1, the lower electrode and the passive layer comprise a conductive material being selected from the group comprising aluminum, chromium, copper, germanium, gold, magnesium, manganese, indium, iron, nickel, palladium, platinum, silver, titanium, zinc, alloys thereof, indium-tin oxide, polysilicon, doped amorphous silicon, and metal suicides.

3. The device of claim 1, the passive layer at least partly comprised of a conductivity facilitating compound.

4. The device of claim 2, the passive layer at least partly comprised of a compound derived at least partly from the conductive material.

5. The device of claim 4, further comprising a top electrode formed on the organic layer.

6. The device of claim 5, the organic layer being comprised of a material selected from the group comprising selected from the group comprising polyacetylene, polyphenylacetylene, polydiphenylacetylene, polyaniline, poly(p-phenylene vinylene), polythiophene, polyporphyrins, porphyrinic macrocycles, thiol derivatized polyporphyrins, polymetallocenes, polyferrocenes, polyphthalocyanines, polyvinylenes, and polystiroles and the top electrode comprising a conductive material selected from the group comprising aluminum, chromium, copper, germanium, gold, magnesium, manganese, indium, iron, nickel, palladium, platinum, silver, titanium, zinc, alloys thereof, indium-tin oxide, polysilicon, doped amorphous silicon, and metal silicides.

7. The device of claim 1, the dish region formed via a reducing CMP process.

8. The device of claim 7, the passive layer formed via the reducing CMP process.

9. The device of claim 7, the reducing CMP process utilizes at least a pad.

10. The device of claim 7, the reducing CMP process utilizes at least a slurry.

11. A method of fabricating an organic memory device comprising:
    depositing a conductive material so as to substantially overfill a trench on the semiconductor device;
    performing a planarization process to substantially remove conductive material from regions outside of the trench;
    forming a dish region as part of a lower electrode in the trench in conjunction with performing the planarization process;
    growing a passive layer comprising a conductivity facilitating compound from conductive material within the trench at the dish region in conjunction with performing the planarization process; and
    forming an organic layer on the passive layer and forming a top electrode on the organic layer.

12. The method of claim 11, wherein the planarization process is a reducing chemical mechanical planarization process that includes a slurry, the slurry comprising a reducing chemistry.

13. The method of claim 12, wherein the reducing chemistry is sulfur.

14. The method of claim 11, wherein the conductivity facilitating compound is copper sulfide.

15. The method of claim 11, wherein performing the planarization process comprises applying a slurry containing a reducing chemistry to the semiconductor device and rotating a polishing pad and/or the memory device.

16. A semiconductor passive layer fabrication system comprising:
    a process component that employs a reducing chemical mechanical planarization (CMP) process to create a dish region from a lower electrode, wherein the fabrication system grows a passive layer within the dish region in conjunction with forming the lower electrode, the passive layer facilitates transport of charge between the bottom electrode and an organic layer region of a top electrode.

17. The system of claim 16, the lower electrode and the passive layer comprise a conductive material.

18. The system of claim 16, the passive layer comprises at least a conductivity facilitating compound derived from the conductive material.

19. The device of claim 16, the organic layer being comprised of a material selected from the group comprising selected from the group comprising polyacetylene, polyphenylacetylene, polydiphenylacetylene, polyaniline, poly(p-phenylene vinylene), polythiophene, polyporphyrins, porphyrinic macrocycles, thiol derivatized polyporphyrins, polymetallocenes, polyferrocenes, polyphthalocyanines, polyvinylenes, and polystiroles and the top electrode comprising a conductive material selected from the group comprising aluminum, chromium, copper, germanium, gold, magnesium, manganese, indium, iron, nickel, palladium, platinum, silver, titanium, zinc, alloys thereof, indium-tin oxide, polysilicon, doped amorphous silicon, and metal silicides.

* * * * *